United States Patent [19]

Zuk

[11] 3,916,333

[45] Oct. 28, 1975

[54] DIFFERENTIAL AMPLIFIER

[76] Inventor: Borys Zuk, New Brunswick, N.J.

[22] Filed: Apr. 27, 1973

[21] Appl. No.: 355,205

[52] U.S. Cl. .................................. 330/30 D; 330/69

[51] Int. Cl.² .............................................. H03F 3/45

[58] Field of Search .................................... 330/30 D

[56] References Cited

UNITED STATES PATENTS

| | | | |
|---|---|---|---|
| 3,564,439 | 2/1971 | Rao | 330/30 D |
| 3,610,955 | 10/1971 | Blaser | 330/30 D X |
| 3,622,903 | 11/1971 | Steckler | 330/30 D |

*Primary Examiner*—Nathan Kaufman

*Attorney, Agent, or Firm*—H. Christoffersen; S. Cohen; A. L. Limberg

[57] ABSTRACT

An amplifier with desirable direct potential translating properties includes an emitter-coupled differential amplifier configuration using first and second composite transistors. Each composite transistor is of quasi-complementary Lin configuration comprising an input transistor and an after-cascaded transistor of complementary conductivity type. Output signal is obtained from the different amplifier by means of common-emitter amplifier output transistor having its base electrode connected to the base electrode of one of the after-cascaded transistors.

6 Claims, 1 Drawing Figure

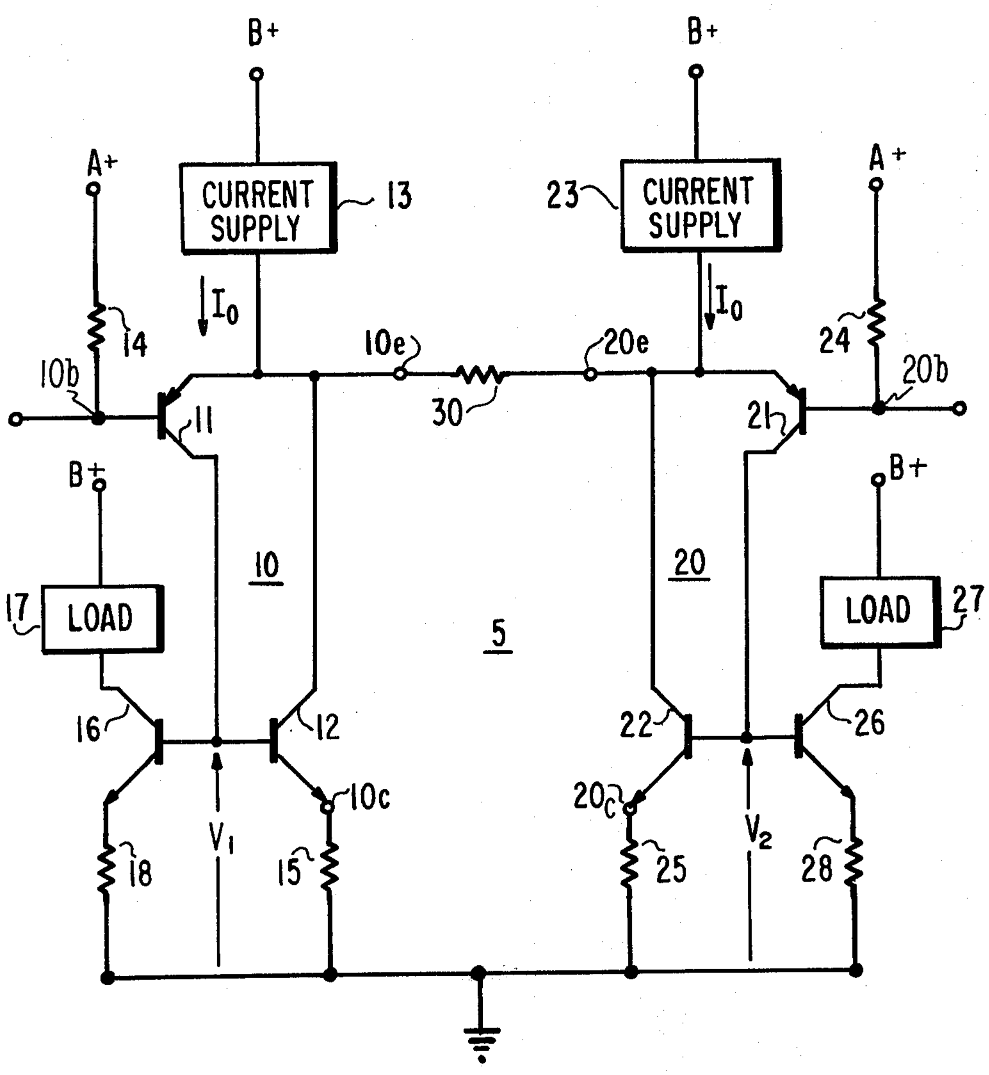
B+
B+
A+
A+
CURRENT SUPPLY
CURRENT SUPPLY
13
23
$I_0$
$I_0$
14
24
10b
20b
10e
20e
30
11
21
B+
B+
10
20
5
17
LOAD
LOAD
27
16
12
22
26
10c
20c
$V_1$
$V_2$
18
15
25
28

DIFFERENTIAL AMPLIFIER

The present invention relates to differential amplifier employing semiconductor amplifier devices having complementary conductivity characteristics.

A differential amplifier configuration well known in the art is the emitter-coupled transistor differential amplifier. A basic problem of this known configuration is that its output signals cannot swing over the entire range of potentials available between the operating and reference potentials supplied to the amplifier. This is particularly so when in order to linearize the amplifier substantial emitter degeneration resistance is used in the coupling together of the emitter electrodes of the amplifier transistors.

A composite transistor configuration herein referred to as the "Lin Configuration" is described in U.S. Pat. No. 2,896,029, entitled "SEMICONDUCTOR AMPLIFIER CIRCUITS," issued to Hung Chang Lin, July 21, 1959, and assigned to RCA Corporation. The Lin Configuration comprises an input transistor having its collector and emitter electrodes respectively connected to the base electrode and to the collector electrode of a subsequent transistor of the opposite conductivity type. The "base," "emitter" and "collector" electrodes of the composite device are at the base electrode of the input transistor, at the interconnection of emitter and collector electrodes, and at the emitter electrode of the subsequent transistor, respectively. The composite transistor acts like a transistor of the same conductivity type as its input transistor.

The present invention is embodied in an emitter-coupled transistor differential amplifier in which the transistors are Lin Configuration composite transistors having their "collector" electrodes connected to a reference potential. Output signal responsive to input signal applied between the "base" electrodes of the composite transistors are obtained from at least one common-emitter transistor amplifier having its base-emitter circuit connected parallelly with one of the transistors of said composite transistors subsequent to their input transistors.

The drawing comprises a single FIGURE, which is a schematic diagram of a differential amplifier embodying the present invention.

The differential amplifier 5 shown therein uses first and second composite Lin Configuration transistors 10, 20. The composite transistor 10 is shown as comprising a PNP input transistor 11 and an NPN subsequent transistor 12 and has a "base electrode," 10*b;* an "emitter" electrode, 10*e*, and a "collector" electrode, 10*c*. The composite transistor 20 is shown as comprising a PNP input transistor 21 and an NPN subsequent transistor 22 and has a "base" electrode, 20*b;* an "emitter" electrode, 20*e;* and a "collector" electrode, 20*c*.

The "emitter" electrodes 10*e* and 20*e* are direct current conductively coupled to each other to form the basic emitter-coupled differential amplifier configuration and are arranged each to be supplied a quiescent "emitter" current of magnitude $I_0$. The FIGURE shows one of the conventional ways of doing this, wherein emitter electrodes 10*e* and 20*e* are coupled together by a resistor 30 and are supplied quiescent currents from current supplies 13 and 23, respectively.

Alternatively, resistor 30 could be replaced by direct connection; and the current supplies 13 and 23, by a single current supply. Another alternative would be to replace the resistor 30 and current supplies 13 and 23 shown in the FIGURE with a single supply providing a current of magnitude $2I_0$ to "emitter" electrodes 10*e* and 20*e* through equal resistance resistors.

The current supplies 13 and 23 (or their replacement) can each comprise a PNP transistor having its base-emitter circuit biased so that constant current is supplied from its collector electrode, for example. Alternatively, other known current supplies can be used. Normally, the current supplies cannot function to supply direct current if the "emitter" electrodes 10*e* and 20*e* swing more positively than an operating potential B+ furnished to those supplies. If PNP transistors biased for constant collector current are used for these current supplies as suggested, emitter electrodes 10*e* and 20*e* cannot swing more positively than a voltage, 0.2 volts, approximately, more negative than the B+ potential applied to the emitter electrodes of the PNP constant-collector-current transistors.

The "base" electrodes 10*b* and 20*b* are shown as being biased via resistors 14 and 24, respectively, to the same quiescent potential, A+, and are adapted for application of input signal therebetween.

The "collector" electrodes 10*c* and 20*c*, are connected to a reference potential, shown in the FIGURE as ground. This connection may be a direct connection. Alternatively, as shown in the FIGURE, it may be via resistors 15 and 25, which are presumed to have low enough resistance that the potential drop across them is less than a volt. In such circumstances, the potential A+ biasing the "base" electrodes 10*b* and 20*b* can have a value within the entire range of potentials between ground reference potential and B+. There is no substantial potential drop required across the "collector" load resistors 15, 25, so that A+ potential can be chosen to be ground potential, for instance. At the other end of the range A+ potential can be chosen to be within about 1 volt of B+ potential and still maintain the base-emitter junctions of transistors 11 and 21 in the requisite forward biased condition for proper operation.

To accomodate this advantage with regard to choice of input bias potential, some way of obtaining output current from the substantially grounded "collector" electrodes 10*c* and 20*c* must be provided. The base-emitter circuits of transistors 12 and 22 develop potentials $v_1$ and $v_2$, respectively, in response to their respective collector currents levels. If potentials $\mu_1$ and $\mu 2$ are respectively applied to the base-emitter circuits of common-emitter amplifier transistors 16 and 26, having transconductance characteristics respectively proportional to those of transistors 12 and 22, then the collector currents of transistors 16 and 26 will be proportional to those of transistors 12 and 22, respectively. The collector currents of common-emitter amplifier transistors 16 and 26 are shown as being supplied to collector loads 17 and 27, respectively, which provide paths for quiescent current flow from B+ potential or other operating potential to the collector electrodes of transistors 16 and 26.

If electrodes 10*c* and 20*c* are directly connected to ground, so too would the emitter electrodes of transistors 16 and 26 be directly connected to ground. Such connections are practicable in integrated circuitry where the transistors 12, 16 (and 22, 26) are thermally coupled to each other. The ratio of the collector current of transistor 16 (or 26) to that of transistor 12 (or 22) would then be as the ratio of the effective areas of their base-emitter junctions, presuming equal current densities in those base-emitter junctions. That is, the ratio of the collector currents of transistors 12 and 16 (or 22 and 26) and of their emitter currents is a function of their geometries and independent of their individual forward current gains.

If resistors 15 and 25 are used as shown in the FIGURE and previously suggested, the emitter electrodes of transistors 16 and 26 are connected to ground reference potential by resistors 18 and 28, respectively. The resistances of resistors 18 and 28 are preferably chosen as follows: (1) in proportion to the resistances of resistors 15 and 25 and (2) in inverse ratio to the proportion of the effectice base-emitter junction areas of transistors 16 and 26 to those of transistors 12 and 22. When this is done or when the emitter electrodes of transistors 12, 22, 16 and 26 are all grounded, the collector currents of transistors 12 and 16 will be proportional to each other as will those of transistors 22 and 26, despite distortion of the $v_1$ and $v_2$ signals as compared to the input signals applied to terminals 10*b* and 20*b*. That is, the composite transistors 10 and 20 will predistort $v_1$ and $v_2$ so as to compensate for the distortion caused by non-linearity of the transfer characteristics of common-emitter amplifier transistors 16 and 26.

The linearity of the overall transfer characteristic of differential amplifier 5 as compared to that of a conventional emitter-coupled transistor differential amplifier is also enhanced by the degenerative feedback afforded the composite transistors 10 and 20 by the connection of the respective emitter electrodes of their input transistors 11 and 21, to the respective collector electrodes of their subsequent transistors 12 and 22.

Output signal potentials appearing between the collector electrodes of transistors 16 and 26 will be of the same phase as the input signal potential applied between terminals 10*b* and 20*b*. This results from the inverting amplifier characteristics of the emitter-coupled transistor differential amplifier comprising composite transistors 10 and 20 being followed by the inverting amplifier characteristics of the common-emitter amplifier transistors 16 and 26.

If transistors 12, 22, 16, 26 are similar and the resistances of resistors 15, 25, 18, 28 are alike--that is, if the conductances of their base-emitter circuits are equal---then the signal voltage gain of amplifier 5 will be substantially equal to the sum of the impedances of the loads 17 and 27 divided by the following quantity: the resistance of resistor 30 plus the sum of the reciprocals of the transconductances of transistors 11 and 21. If the conductances of the base-emitter circuits of transistors 16 and 26 are equal and larger than the equal conductance of the transistors 12 and 22 by a certain multiple, the signal voltage gain will be increased over the case where all such conductances are equal by that certain multiple.

The output signals applied to loads 17 and 27 each can swing over substantially the entire range of potential from ground to B+ potential. The amplifier 5 can therefore provide as large output signal swings as possible for a given B supply potential. Alternatively, a load circuit may be connected in bridge between the collector electrodes of transistors 16 and 26, which collector electrodes would then be afforded direct current paths to B+ potential by other means (e.g. by means of resistors or the collector-to-emitter paths of PNP transistors). When balanced output signals are not required of the amplifier 5, one of the common-emitter transistor amplifier stages 16, 17, 18 or 26, 27, 28 may be dispensed with.

The amplifier 5 may be realized with NPN transistor types replacing PNP types and vice versa. Amplifier 5 can be built with types of transistors other than bipolar. The term "transistor" in the claims is a generic term encompassing bipolar and field effect transistors. The terms "input electrode," "output electrode" and "common-electrode" are descriptive of the base, collector and emitter electrodes, respectively, of a bipolar transistor and of the gate, drain and source electrodes, respectively, of a field effect transistor.

What is claimed is:

1. An amplifier comprising:

first and second transistors, each being of a first conductivity type, each having an input electrode and a common electrode and an output electrode;

means for supplying bias potential to each of the input electrodes of said first and said second transistors and an input signal between the input electrodes of said first and said second transistors;

means coupling the common electrodes of said first and said second transistors to each other for signal;

third and fourth and fifth transistors, being of a second conductivity type complementary to said first conductivity type, each having a common electrode connected to a point of reference potential and each having an output electrode, said third and said fifth transistors each having an input electrode direct coupled from said first transistor output electrode, said fourth transistor having an input electrode direct coupled from said second transistor output electrode;

a first direct current conductive path having a first end connected to the output electrode of said third transistor and having a second end connected to the common electrode of said first transistor;

a second direct current conductive path having a first end connected to the output electrode of said fourth transistor and having a second end connected to the common electrode of said second transistor;

means connected to the second end of said first direct current conductive path and to the second end of said second direct current conductive path for supplying quiescent currents to said first transistor common electrode, to said second transistor common electorde, to said third transistor output electrode, and to said fourth transistor output electrode; and means for connecting said fifth transistor output electrode to receive an operating potential and for utilizing the output signal provided at said fifth transistor output electrode in response to said input signal.

2. An amplifier as claimed in claim 1 wherein:

said first transistor output electrode is directly connected to the joined input electrodes of said third and said fifth transistor; and said second transistor output electrode is directly connected to the joined input electrodes of said fourth transistor.

3. An amplifier as claimed in claim 1 having a sixth transistor, being of said second conductivity type, having an input electrode direct coupled from said second transistor output electrode, having a common electrode connected to said point of reference potential and having an output electrode means for connecting said sixth transistor output electrode to receive an operating potential and for utilizing the output signal provided thereat in response to said input signal.

4. An amplifier as claimed in claim 1 wherein each of the common electrodes of said third, said fourth and said fifth transistors are directly connected to each other and to said reference potential.

5. An amplifier as claimed in claim 1 wherein:

said third and said fifth transistor each have a base-emitter junction between their input and common electrodes and first and second resistive elements connect the common electrodes of said third and said fifth transistors respectively to said reference potential, the ratio of the resistances of said first and said second resistive elements being inversely proportional to the ratio of the effective areas of the base-emitter junctions of said third and said fifth transistors, respectively.

6. An amplifier comprising:

first and second composite transistors of the Lin configuration, each including an input transistor and a subsequent transistor respectively of first and of second complementary conductivity types, each of said input and subsequent transistors having input and common and output electrodes, in each Lin configuration the output electrode of the input transistor being coupled to the input electrode of the subsequent transistor and the common electrode of the input transistor being coupled to the output electrode of the subsequent transistor, means connecting said first and said second composite transistors in a differential amplifier configuration including a coupling between the common electrodes of their respective input transistors;

an auxiliary transistor having input and common electrodes respectively connected to the input and common electrodes of said subsequent transistor in said first composite transistor, and having an output electrode;

a load with a direct current path therethrough; and a source of operating potential to which said auxiliary transistor output electrode is connected via the direct current path through said load.

* * * * *

UNITED STATES PATENT OFFICE
CERTIFICATE OF CORRECTION

PATENT NO. : 3,916,333

DATED : October 28, 1975

INVENTOR(S) : Borys Zuk

It is certified that error appears in the above-identified patent and that said Letters Patent are hereby corrected as shown below:

After "[76] Inventor: Borys Zuk, New Brunswick, N.J."
Insert --- Assignee: RCA Corporation, N.Y., N.Y. ---

| | |
|---|---|
| Column 1, line 3 | "amplifier" should read --- amplifiers --- |
| Column 2, line 48 | "$\mu_1$ and $\mu 2$" should read --- $\upsilon_1$ and $\upsilon_2$ --- |
| Column 4, line 50 | "electorde" should read --- electrode --- |
| line 61 | after "and" insert --- wherein --- |
| line 65 | after "having" insert --- : --- |
| line 66 | before "a sixth transistor" insert --- (a) --- |
| Column 5, line 3 | after "electrode" insert --- and --- |
| line 4 | before "means for" insert --- (b) --- |

Signed and Sealed this

*eleventh* Day of *May 1976*

[SEAL]

*Attest:*

RUTH C. MASON
*Attesting Officer*

C. MARSHALL DANN
*Commissioner of Patents and Trademarks*